(12) United States Patent
Ao

(10) Patent No.: US 10,854,405 B2
(45) Date of Patent: Dec. 1, 2020

(54) RELAY DIAGNOSTIC CIRCUIT

(71) Applicant: Contemporary Amperex Technology Co., Limited, Fujian (CN)

(72) Inventor: Xiang Ao, Fujian (CN)

(73) Assignee: Contemporary Amperex Technology Co., Limited, Ningde (CN)

(*) Notice: Subject to any disclaimer, the term of this patent is extended or adjusted under 35 U.S.C. 154(b) by 376 days.

(21) Appl. No.: 15/896,107

(22) Filed: Feb. 14, 2018

(65) Prior Publication Data

US 2018/0240629 A1 Aug. 23, 2018

(30) Foreign Application Priority Data

Feb. 23, 2017 (CN) .......................... 2017 1 0099308

(51) Int. Cl.
| | | |
|---|---|---|
| *H01H 47/00* | (2006.01) | |
| *H02J 7/00* | (2006.01) | |
| *G01R 31/327* | (2006.01) | |
| *B60L 3/00* | (2019.01) | |
| *G01R 31/00* | (2006.01) | |
| *B60L 58/10* | (2019.01) | |

(52) U.S. Cl.
CPC ......... *H01H 47/002* (2013.01); *B60L 3/0046* (2013.01); *B60L 58/10* (2019.02); *G01R 31/006* (2013.01); *G01R 31/3278* (2013.01); *H02J 7/0026* (2013.01); *H01H 47/001* (2013.01)

(58) Field of Classification Search
CPC ..... B60L 3/0046; B60L 58/10; G01R 31/006; G01R 31/3278; H01H 47/001; H01H 47/002; H02J 7/0026
See application file for complete search history.

(56) References Cited

U.S. PATENT DOCUMENTS

| 5,089,926 A | * | 2/1992 | Kugelman | G01R 19/00 340/640 |
| 8,688,317 B2 | * | 4/2014 | Boiron | G01R 31/3278 701/33.8 |
| 10,084,334 B1 | * | 9/2018 | Dao | H02J 7/35 |

FOREIGN PATENT DOCUMENTS

| CN | 204556787 U | * | 8/2015 |
| CN | 105988082 A | * | 10/2016 |

OTHER PUBLICATIONS

CN105988082A Translation (Year: 2020).*
CN204556787U Translation (Year: 2020).*

* cited by examiner

*Primary Examiner* — Son T Le
*Assistant Examiner* — Adam S Clarke

(57) ABSTRACT

The present invention discloses a relay diagnostic circuit for a number of relays connected in series between an electric vehicle power supply end and a load or a charging end. The relay diagnostic circuit includes a number of voltage divider branches connected to a same reference ground, an isolation unit and a judgment unit. Each of the voltage divider branches is configured to obtain the voltage of one end of each relay and output the voltage after dividing the voltage. The isolation unit is configured to isolate and convert a number of divider voltages output from the number of voltage divider branches and output the voltages to the judgment unit. The judgment unit is configured to compare a comparison information of divided voltages at two ends of each relay with a corresponding driving state of the relay and obtain the diagnosis result of each relay.

8 Claims, 5 Drawing Sheets

RELAY DIAGNOSTIC CIRCUIT

CROSS-REFERENCE TO RELATED APPLICATION

The present application claims priority to Chinese patent application No. 201710099308.X filed on Feb. 23, 2017, the whole disclosure of which is incorporated herein by reference.

BACKGROUND OF THE INVENTION

Field of the Invention

The present invention generally relates to relays and, more particularly, to a relay diagnostic circuit.

Description of the Related Art

The diagnosis of a relay state is an important function of new energy electric vehicles, which can diagnose and find risks in the event of adhesion, open circuit and other abnormal state of the relay timely, and can carry out alarm, protection and other actions before safety accidents, so as to significantly reduce the loss of personal property due to relay failure.

The diagnosis of a relay state is an important function of new energy electric vehicles, which can diagnose and find risks in the event of adhesion, open circuit and other abnormal state of the relay timely, and can carry out alarm, protection and other actions before safety accidents, so as to significantly reduce the loss of personal property due to relay failure.

With the promotion and popularization of new energy vehicles, more and more attention has been paid to the failure of high-voltage relays in new energy vehicles, and more and more attention has been paid to on how to achieve the diagnosis of the relay state effectively, inexpensively and simply.

However, the conventional relay diagnostic circuit at least has the following disadvantages.

Firstly, in order to solve the problem of using the relay auxiliary contact to detect the failure of relay is not reliable enough, a method of voltage sampling of the relay contacts is used instead of using a relay with auxiliary contacts in the conventional relay diagnostic circuits. The failure of the relay can be determined via the sampling voltage. However, the voltage sampling circuit of this method is complex and expensive, and the failure judgment logic is complicated.

Secondly, in order to solve the problem that the state of the charging relay disconnected from a charging gun is difficult to be detected when the outside of the electric vehicle charging relay is suspended, the cross voltages are sampled on the inside of the main positive relay and the inside of the main negative relay in conventional relay diagnostic circuits. A voltage difference between the relay contacts is formed by a sampling resistor to assist testing status. However, outside circuit of the relay will form a potential reverse current path due to cross voltage sampling, and if the circuit forms a negative voltage which is applied to a high voltage device which is sensitive to the negative voltage eventually, it will cause damage to the high voltage equipment.

It is desirable to provide a relay diagnostic circuit which can avoid potential reverse current problems in cross voltage sampling

SUMMARY OF THE INVENTION

One object of the present invention is to provide a relay diagnostic circuit which can avoid potential reverse current problems in cross voltage sampling.

According to one embodiment of the present invention, a relay diagnostic circuit for a number of relays connected in series between an electric vehicle power supply end and a load or a charging end includes a number of voltage divider branches connected to a same reference ground, an isolation unit and a judgment unit, wherein each of the voltage divider branches is configured to obtain a voltage of one end of each relay and output the voltage after dividing the voltage;

the isolation unit is configured to isolate and convert a number of divider voltages output from the number of voltage divider branches and output the voltages output to the judgment unit; and the judgment unit is configured to compare a comparison information of the divider voltages at two ends of each relay with a corresponding driving state of the relay and obtain a diagnosis result of each relay.

According to one aspect of the present invention, each of the voltage divider branches includes at least two divider resistors in series, a connection point of the divider resistor is an output end of the voltage divider branch to output the divider voltage, each relay corresponds to two voltage divider branches, a first end of each relay is connected to one end of a corresponding voltage divider branch, a second end of the relay is connected to one end of another corresponding voltage divider branch, and other ends of all voltage divider branches are connected to a same reference ground.

According to one aspect of the present invention, the isolation unit includes optocouplers, driving ends of the optocouplers are connected to corresponding output ends of the voltage divider branches respectively, and output ends of the optocouplers are connected to input end of the judgment unit.

According to one aspect of the present invention, the isolation unit includes an isolation chip, input ends of the isolation chip are connected to corresponding output ends of the voltage divider branches respectively, and the output ends of the isolation chip are connected to an input end of the judgment unit.

According to one aspect of the present invention, the relay diagnostic circuit further includes a comparison unit configured to compare divider voltages output from two voltage divider branches at both ends of a same relay, output the comparison information to the isolation unit, and output the comparison information to the judgment unit after isolation and conversion of the isolation unit.

According to one aspect of the present invention, the comparison unit includes a number of comparator groups, each comparator group includes a forward comparator and a reverse comparator, two comparators of a same comparator group corresponds to a same relay, output ends of one of the voltage divider branches for obtaining output voltage of the first end of corresponding relay is connected to a positive input end of the forward comparator and a negative input end of the reverse comparator, output ends of the other voltage divider branch for obtaining output voltage of the second end corresponding to the relay is connected to the negative input end of the forward comparator and the positive input end of the reverse comparator, output ends of the forward comparator and the reverse comparator of each comparator group are connected as a output end of the comparator group, and output ends of each comparator group are connected to input end of the isolation unit respectively.

According to one aspect of the present invention, the relay diagnostic circuit further includes an analog-to-digital conversion unit configured to convert the divider voltage output from a voltage divider branch into digital information and output the digital information to the isolation unit, and output the digital information to the judgment unit after isolation and conversion of the isolation unit.

According to one aspect of the present invention, the analog-to-digital conversion unit is an analog-to-digital conversion chip, input ends of the analog-to-digital conversion chip are connected to corresponding output ends of the voltage divider branches respectively, and output ends of the analog-to-digital conversion chip are connected to input end of the isolation unit.

According to one aspect of the present invention, the analog-to-digital conversion unit is a slave MCU, input ends of the slave MCU are connected to corresponding output ends of the voltage divider branches respectively, and the output ends of the slave MCU are connected to the input end of the isolation unit.

According to one aspect of the present invention, the judgment unit is a master MCU and an input end of the master MCU is connect to an output end of the isolation unit.

Compared with the prior art, the relay diagnostic circuit according to the present invention has the following advantages.

The two reference grounds in the cross voltage sampling are combined into a reference ground by optimizing the resistance topology, so as to avoid the problem of potential reverse current.

At the same time, the reliability of the circuit has been improved by replacing the ADC sampling chip with a comparator chip to reduce circuit complexity. The reliability of the circuit has been improved by combining the two isolated power supplies in the cross voltage sampling into one isolated power supply to reduce circuit complexity.

In addition, the use of comparator logic output judgments rather than the numerical operations and logical judgments after ADC sampling can significantly reduce the computational complexity.

BRIEF DESCRIPTION OF THE DRAWINGS

Other advantages and novel features will be drawn from the following detailed description of preferred embodiments with the attached drawings. The accompanying drawings, which are incorporated in and constitute a part of this specification, illustrate embodiments of the present invention and, together with a general description of the invention given above, and the detailed description of the embodiments given below, serve to explain the principles of the invention, in which.

DETAILED DESCRIPTION OF THE PREFERRED EMBODIMENTS

Figure 1:
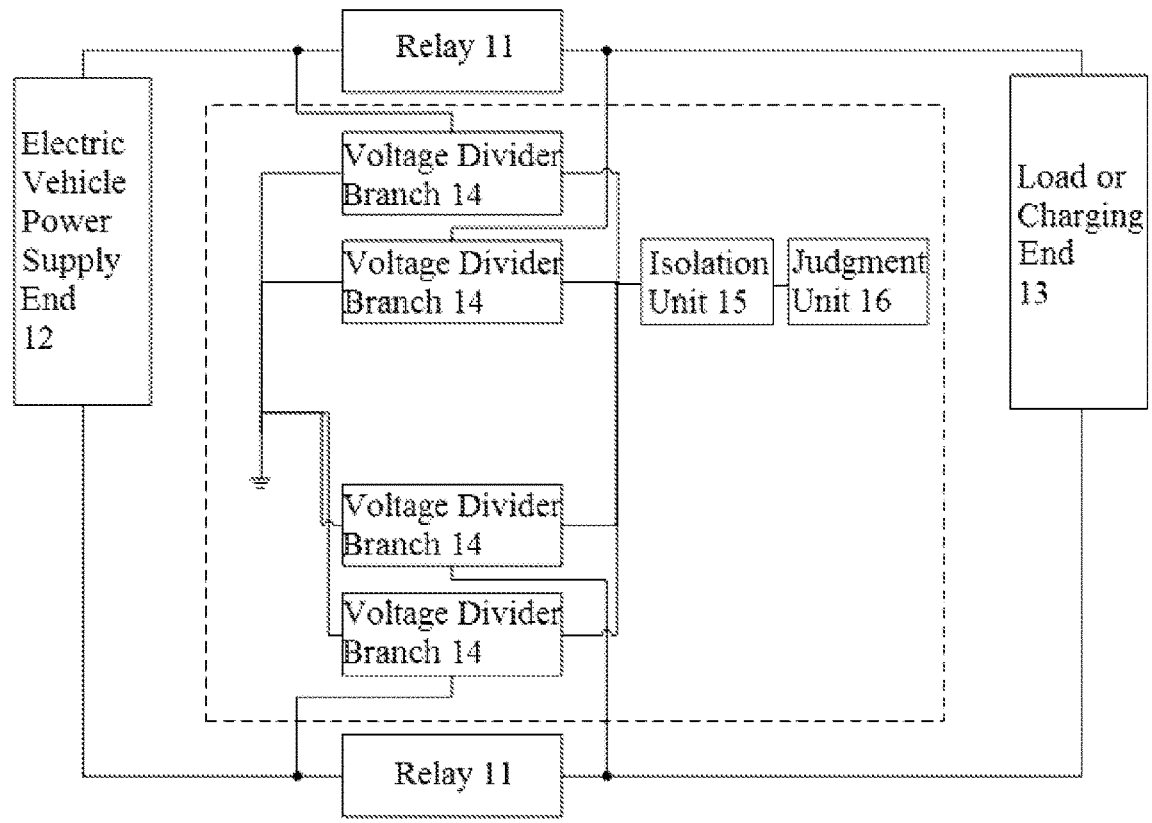
FIG. 1 depicts a schematic diagram of a relay diagnostic circuit according to one embodiment of the present invention.

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

As shown in FIG. 1, a relay diagnostic circuit for a number of relays 11 connected in series between an electric vehicle power supply end 12 and a load or a charging end 13 according to one embodiment of the present invention includes: a number of voltage divider branches connected to a same reference ground 14, an isolation unit 15 and a judgment unit 16, wherein:

each of the voltage divider branches 14 is configured to obtain a voltage of one end of each relay and output the voltage after dividing the voltage;

the isolation unit 15 is configured to isolate and convert a number of divider voltages output from the number of voltage divider branches and output the voltages to the judgment unit; and the judgment unit 16 is configured to compare a comparison information of the divider voltages at two ends of each relay with a corresponding driving state of the relay and obtain a diagnosis result of each relay.

More specifically, each voltage divider branches 14 obtains the voltages at two ends of the relay 11 and outputs the voltage by voltage dividing, and the judgment unit 16 is prevented from being affected by the isolation unit 15.

When the relay 11 is in a state of disconnection and a voltage difference across the relay 11 is relatively large, it can be judged that the relay has been in non-adhesion.

When the relay 11 is in the state of disconnection and a voltage difference across the relay 11 is closes to zero, it can be judged that the relay has been in adhesion.

When the relay 11 is closed and a voltage difference across the relay 11 is relatively large, it can be judged that the relay has been in a state of open circuit failure.

When the relay 11 is closed and a voltage difference across the relay 11 is closes to zero, it can be judged that the relay has not been in a state of open circuit failure.

The present invention realizes the detection of the state of the relay. In addition, the two reference grounds in cross voltage sampling are combined into a reference ground by optimizing the resistance topology so as to avoid the problem of potential reverse current. At the same time, via combining the two isolated power supplies in cross voltage sampling into an isolated power supply to reduce circuit complexity, the circuit reliability has been improved.

In one embodiment of the relay diagnostic circuit of the present invention, each of the voltage divider branches includes at least two voltage divider resistors in series, the connection point of the voltage divider resistors is the output end of the voltage divider branch to output the divider voltage, each relay corresponds to two voltage divider branches, the first end of each relay is connected to one end of a corresponding voltage divider branch, the second end of the relay is connected to one end of another corresponding voltage divider branch, and the other ends of all voltage divider branches are connected to a same reference ground.

Figure 2:
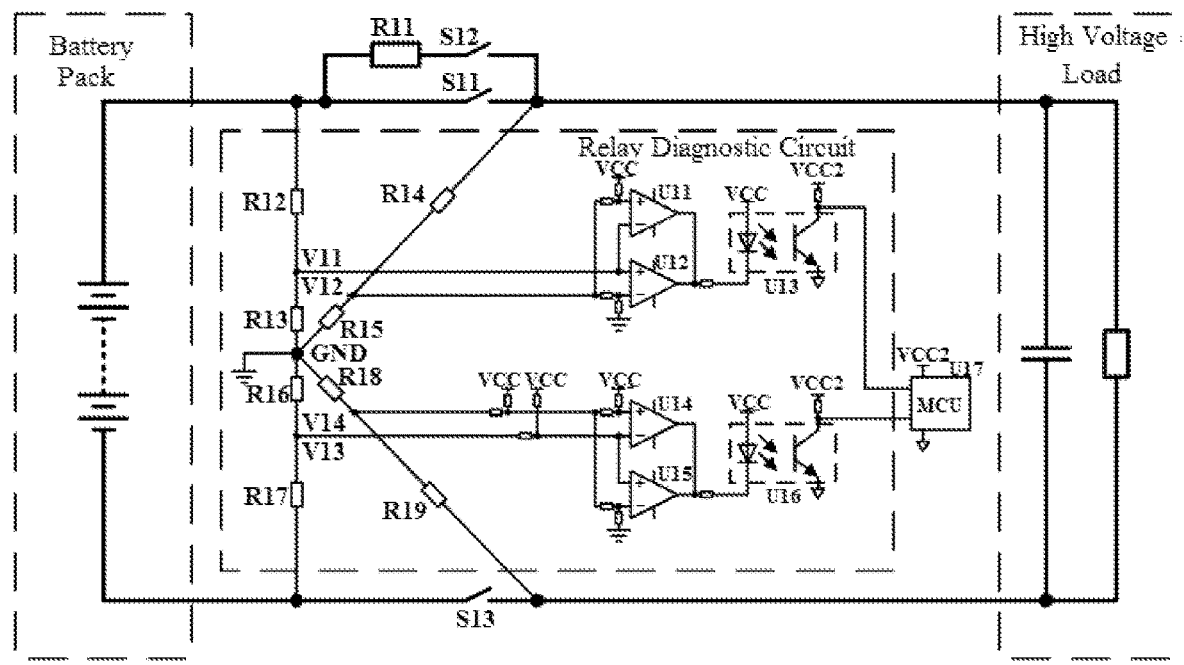
FIG. 2 depicts a circuit diagram of a relay diagnostic circuit according to one embodiment of the present invention.

As shown in FIG. 2, the power supply end is a battery pack for electric vehicles, the load or the charging end is a high voltage load (such as DC/DC, motor drive, etc.). The battery pack is directly connected to the high voltage load through a main positive relay S11 and the main negative relay S13 for energy transmission. In general, it is necessary to precharge the input capacitance of the high voltage load before closing the main positive relay S11, and the precharge is achieved by the precharge relay S12 and the precharge resistor R11.

In which, the voltage divider resistors R12, R13 and R14, R15 form two voltage divider branches to obtain two voltages at both ends of the main positive relay S11 and the precharge relay S12 respectively, and divide the voltage. The voltage divider resistors R16, R17 and R18, R19 form two voltage divider branches to obtain two voltages at both ends of the main negative relay S13 respectively, and divide the voltage. The voltage divider branches of the voltage divider resistors R12, R13 and R14, R15 and the voltage divider branches of the voltage divider resistors R16, R17 and R18, R19 have a same reference ground.

The voltage difference across the contacts of the main positive relay S11 is reflected in V11 and V12 by the voltage divider resistors R12, R13 and R14, R15 connected to the reference GND. The voltage difference across the contacts of the main negative relay S13 is reflected in V13 and V14 by the voltage divider resistors R16, R17 and R18, R19 connected to the reference GND.

Figure 3:
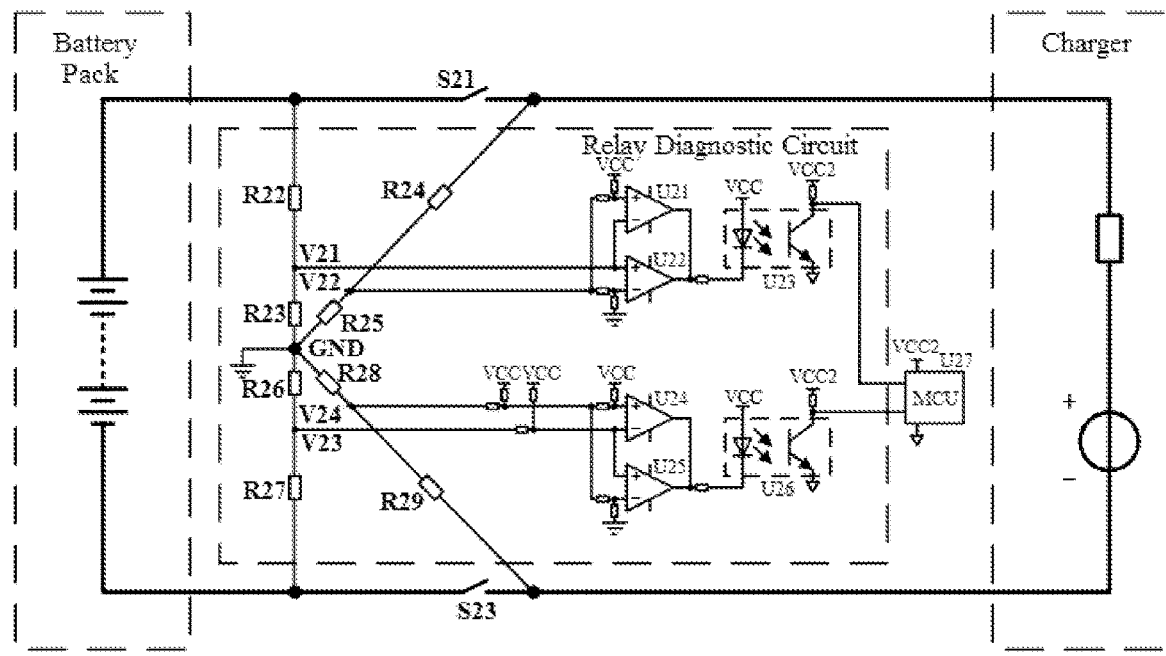
FIG. 3 depicts a circuit diagram of a relay diagnostic circuit according to another embodiment of the present invention.

As shown in FIG. 3, the power supply end is a battery pack for electric vehicles, the load or the charging end is a charger (such as DC charging pile), the battery pack is directly connected to the charger through the charging positive relay S21 and the charging negative relay S23 for energy transmission.

In which, the voltage divider resistors R22, R23 and R24, R25 form two voltage divider branches to obtain two voltages at both ends of the main positive relay S21 and the precharge relay S22 respectively, and divide the voltage, the voltage divider resistors R26, R27 and R28, R29 form two voltage divider branches to obtain two voltages at both ends of the main negative relay S23 respectively, and divide the voltage. The voltage divider branches of the voltage divider resistors R22, R23 and R24, R25 and the voltage divider branches of the voltage divider resistors R26, R27 and R28, R29 have a same reference ground.

The voltage difference across the contacts of the main positive relay S21 is reflected in V21 and V22 by the voltage divider resistors R22, R23 and R24, R25 connected to the reference GND. The voltage difference across the contacts of the main negative relay S23 is reflected in V23 and V24 by the voltage divider resistors R26, R27 and R28, R29 connected to the reference GND.

Figure 4:
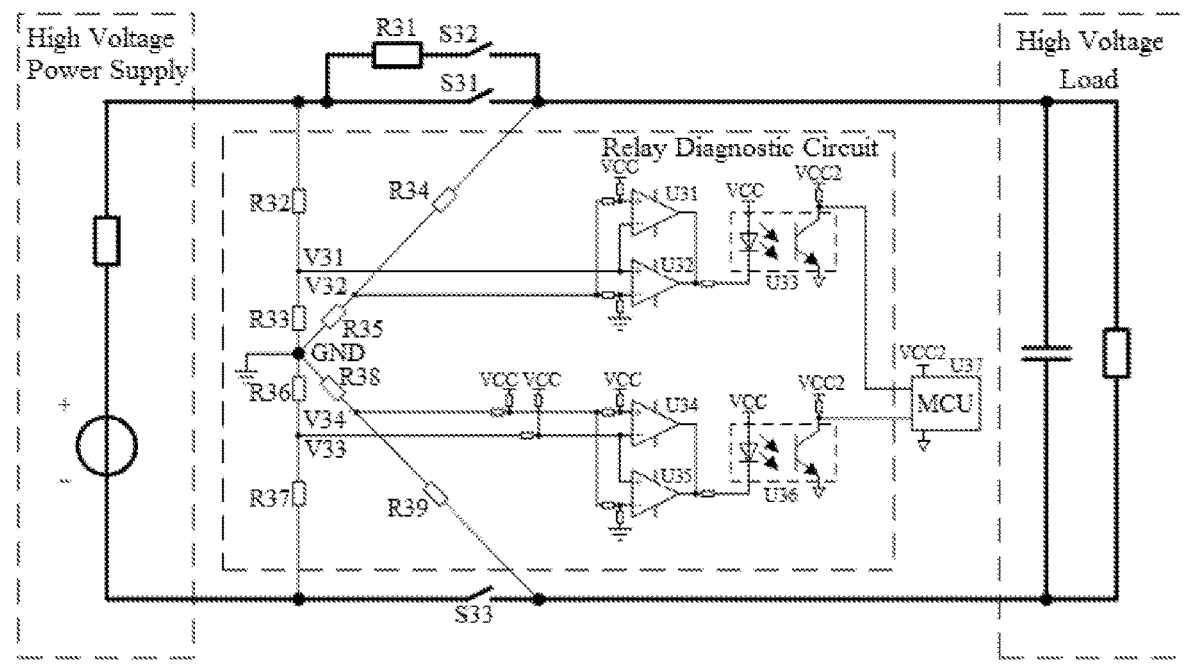
FIG. 4 depicts a circuit diagram of a relay diagnostic circuit according to a yet another embodiment of the present invention.

As shown in FIG. 4, the power supply end is a high voltage power supply, the load or the charging end is a high voltage load (such as motor drives), the high voltage power supply is directly connected to the high voltage load through the main positive relay S31 and the main negative relay S33 for energy transmission. In general, it is necessary to precharge the input capacitance of the high voltage load before closing the main positive relay S31, and the precharge is achieved by the precharge relay S32 and the precharge resistor R31.

In which, the voltage divider resistors R32, R33 and R34, R35 form two voltage divider branches to obtain two voltages at both ends of the main positive relay S31 and the precharge relay S32 respectively, and divide the voltage. The voltage divider resistors R36, R37 and R38, R39 from two voltage divider branches to obtain two voltages at both ends of the main negative relay S33 respectively, and divide the voltage. The voltage divider branches of the voltage divider resistors R32, R33 and R34, R35 and the voltage divider branches of the voltage divider resistors R36, R37 and R38, R39 have the same reference ground.

The voltage difference across the contacts of the main positive relay S31 is reflected in V31 and V32 by the voltage divider resistors R32, R33 and R34, R35 connected to the reference GND. The voltage difference across the contacts of the main negative relay S33 is reflected in V33 and V34 by the voltage divider resistors R36, R37 and R38, R39 connected to the reference GND.

Figure 5:
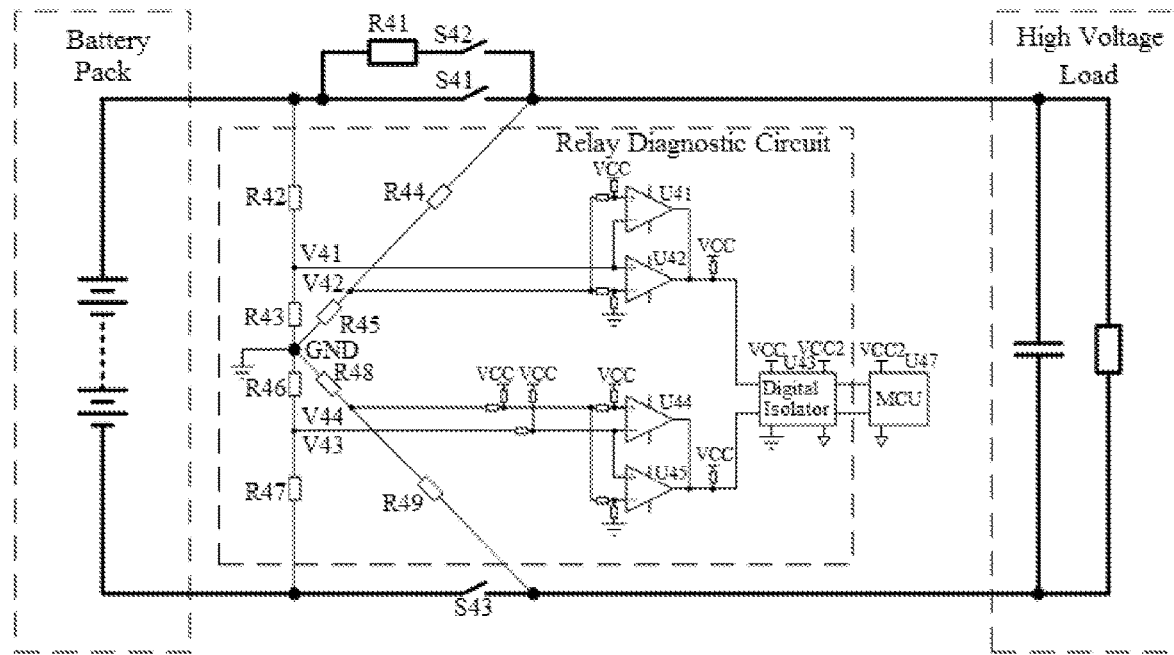
FIG. 5 depicts a circuit diagram of a relay diagnostic circuit according to a further embodiment of the present invention.

As shown in FIG. 5, the power supply end is a battery pack for electric vehicles, the load or the charging end is a high voltage load (such as DC/DC, motor drive, etc.), the battery pack is directly connected to the high voltage load through the main positive relay S41 and the main negative relay S43 for energy transmission. In general, it is necessary to precharge the input capacitance of the high voltage load before closing the main positive relay S41, and the precharge is achieved by the precharge relay S42 and the precharge resistor R41.

In which, the voltage divider resistors R42, R43 and R44, R45 form two voltage divider branches to obtain two voltages at both ends of the main positive relay S41 and the precharge relay S42 respectively, and divide the voltage. The voltage divider resistors R46, R47 and R48, R49 form two voltage divider branches to obtain two voltages at both ends of the main negative relay S43 respectively, and divide the voltage. The voltage divider branches of the voltage divider resistors R42, R43 and R44, R45 and the voltage divider branches of the voltage divider resistors R46, R47 and R48, R49 have the same reference ground.

The voltage difference across the contacts of the main positive relay S41 is reflected in V41 and V42 by the voltage divider resistors R42, R43 and R44, R45 connected to the reference GND. The voltage difference across the contacts of the main negative relay S43 is reflected in V43 and V44 by the voltage divider resistors R46, R47 and R48, R49 connected to the reference GND.

Figure 6:
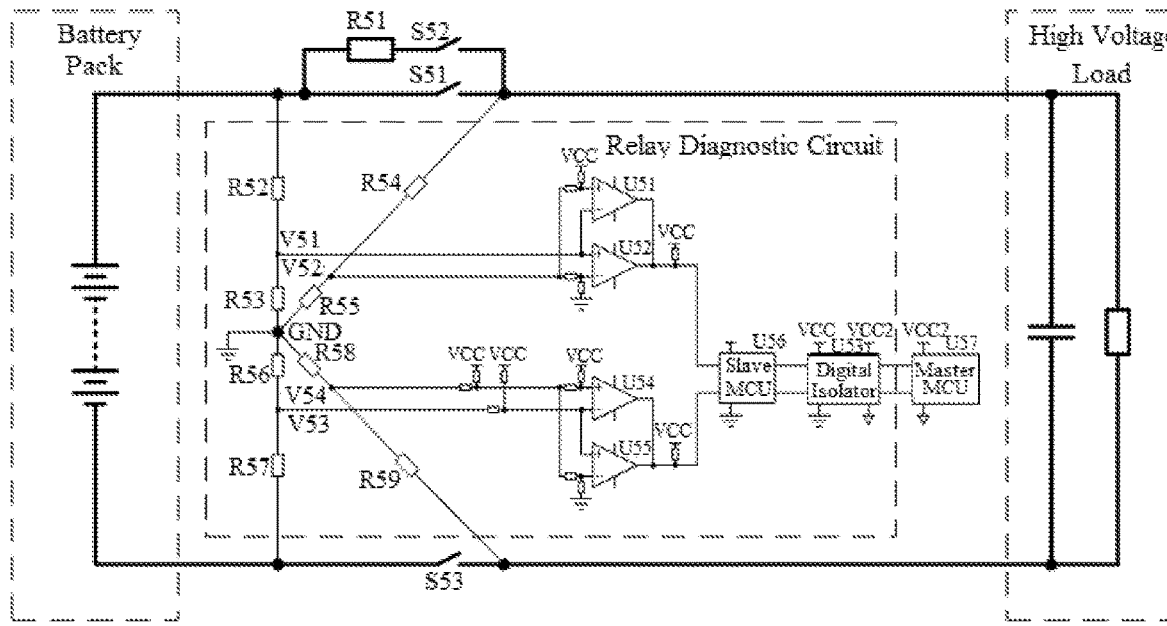
FIG. 6 depicts a circuit diagram of a relay diagnostic circuit according to a further embodiment of the present invention.

As shown in FIG. 6, the power supply end is a battery pack for electric vehicles, the load or the charging end is a high voltage load (such as DC/DC, motor drive, etc.), the battery pack is directly connected to the high voltage load through the main positive relay S51 and the main negative relay S53 for energy transmission. In general, it is necessary to precharge the input capacitance of the high voltage load before closing the main positive relay S51, and the precharge is achieved by the precharge relay S52 and the precharge resistor R51.

In which, the voltage divider resistors R52, R53 and R54, R55 form two voltage divider branches to obtain two voltages at both ends of the main positive relay S51 and the precharge relay S52 respectively, and divide the voltage. The voltage divider resistors R56, R57 and R58, R59 form two voltage divider branches to obtain two voltages at both ends of the main negative relay S53 respectively, and divide the voltage. The voltage divider branches of the voltage divider resistors R52, R53 and R54, R55 and the voltage divider branches of the voltage divider resistors R56, R57 and R58, R59 have the same reference ground.

The voltage difference across the contacts of the main positive relay S51 is reflected in V51 and V52 by the voltage divider resistors R52, R53 and R54, R55 connected to the reference GND. The voltage difference across the contacts of the main negative relay S53 is reflected in V53 and V54 by the voltage divider resistors R56, R57 and R58, R59 connected to the reference GND.

Figure 7:
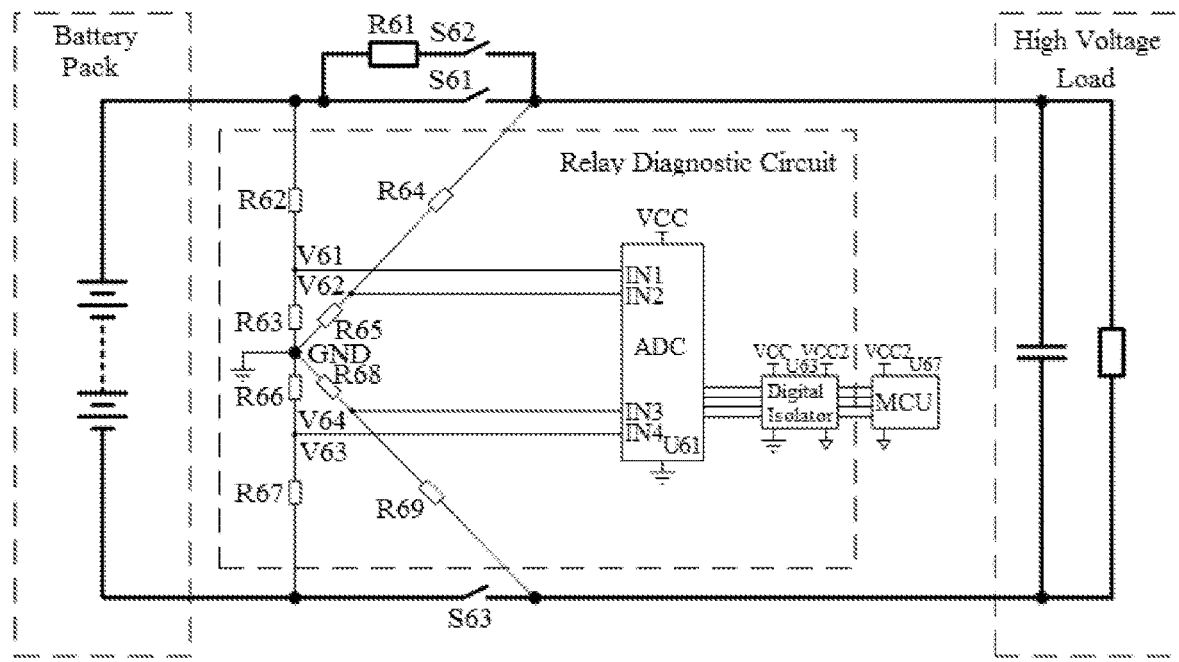
FIG. 7 depicts a circuit diagram of a relay diagnostic circuit according to a further embodiment of the present invention.

As shown in FIG. 7, the power supply end is a battery pack for electric vehicles, the load or the charging end is a high voltage load (such as DC/DC, motor drive, etc.), the battery pack is directly connected to the high voltage load through the main positive relay S61 and the main negative relay S63 for energy transmission. In general, it is necessary to precharge the input capacitance of the high voltage load before closing the main positive relay S61, and the precharge is achieved by the precharge relay S62 and the precharge resistor R61.

In which, the voltage divider resistors R62, R63 and R64, R65 form two voltage divider branches to obtain two voltages at both ends of the main positive relay S61 and the precharge relay S62 respectively, and divide the voltage. The voltage divider resistors R66, R67 and R68, R69 form two voltage divider branches to obtain two voltages at both ends of the main negative relay S63 respectively, and divide the voltage. The voltage divider branches of the voltage divider resistors R62, R63 and R64, R65 and the voltage divider branches of the voltage divider resistors R66, R67 and R68, R69 have the same reference ground.

The voltage difference across the contacts of the main positive relay S61 is reflected in V61 and V62 by the voltage divider resistors R62, R63 and R64, R65 connected to the reference GND. The voltage difference across the contacts of the main negative relay S63 is reflected in V63 and V64 by the voltage divider resistors R66, R67 and R68, R69 connected to the reference GND.

Figure 8:
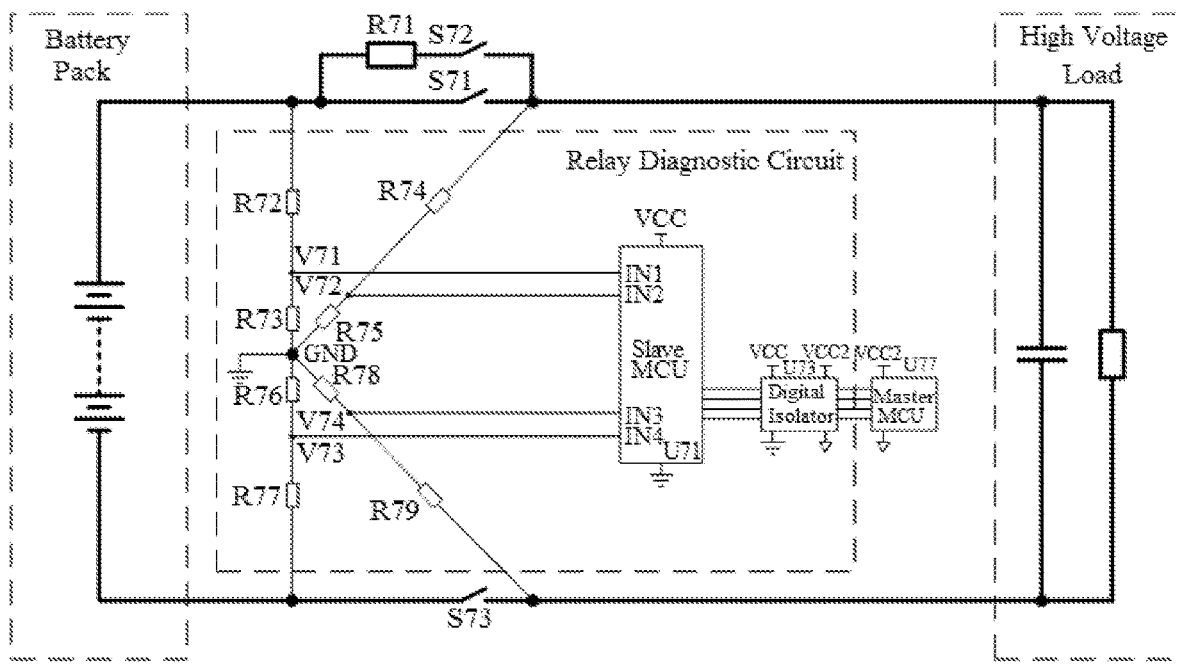
FIG. 8 depicts a circuit diagram of a relay diagnostic circuit according to a further embodiment of the present invention.

As shown in FIG. 8, the power supply end is a battery pack for electric vehicles, the load or the charging end is a high voltage load (such as DC/DC, motor drive, etc.), the battery pack is directly connected to the high voltage load through the main positive relay S71 and the main negative relay S73 for energy transmission. In general, it is necessary to precharge the input capacitance of the high voltage load before closing the main positive relay S71, and the precharge is achieved by the precharge relay S72 and the precharge resistor R71.

In which, the voltage divider resistors R72, R73 and R74, R75 form two voltage divider branches to obtain two voltages at both ends of the main positive relay S71 and the precharge relay S72 respectively, and divide the voltage. The voltage divider resistors R76, R77 and R78, R79 form two voltage divider branches to obtain two voltages at both ends of the main negative relay S73 respectively, and divide the voltage. The voltage divider branches of the voltage divider resistors R72, R73 and R74, R75 and the voltage divider branches of the voltage divider resistors R76, R77 and R78, R79 have the same reference ground.

The voltage difference across the contacts of the main positive relay S71 is reflected in V71 and V72 by the voltage divider resistors R72, R73 and R74, R75 connected to the reference GND. The voltage difference across the contacts of the main negative relay S73 is reflected in V73 and V74 by the voltage divider resistors R76, R77 and R78, R79 connected to the reference GND.

Figure 9:
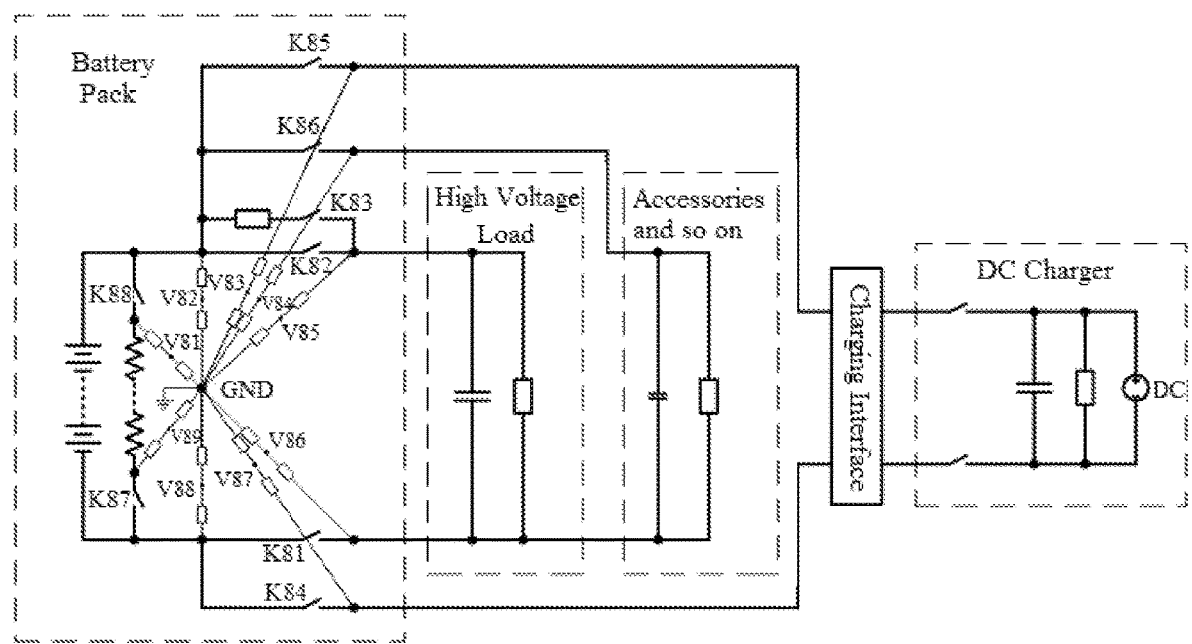
FIG. 9 depicts a circuit diagram of a relay diagnostic circuit according to a further embodiment of the present invention.

As shown in FIG. 9, the power supply end is a battery pack for electric vehicles, the load or the charging end is a high voltage load (such as DC/DC, motor drive, etc.), DC charger, accessories and so on. The battery pack is directly connected to the high voltage load through the main positive relay K82 and the main negative relay K81 for energy transmission. In general, it is necessary to precharge the input capacitance of the high voltage load before closing the main positive relay K82, and the precharge is achieved by the precharge relay K83 and the precharge resistor. The battery pack is connected through the accessories relay K86 and the main negative relay K81 for energy transmission with the accessories. The battery pack is directly connected to the DC charger through the charging positive relay K85 and the charging negative relay K84 for energy transmission. The battery pack is connected to a heating film therein through the heating positive relay K88 and the heating negative relay K87 for energy transmission.

In which, the divider voltages of the main positive replay K82 are reflected in V82 and V85, the divider voltages of the main negative replay K81 are reflected in V88 and V86, the divider voltages of the charging negative relay K84 are reflected in V88 and V87, the divider voltages of the charging positive relay K85 are reflected in V82 and V83, the divider voltages of the the accessories relay K86 are reflected in V82 and V84, the divider voltages of the heating negative relay K87 are reflected in V88 and V89, and the divider voltages of the heating positive relay K88 are reflected in V82 and V81.

In one embodiment of the relay diagnostic circuit of the present invention, the isolation unit includes optocouplers, the driving ends of the optocouplers are respectively connected to the output ends of the voltage divider branches, and the output ends of the optocouplers are connected to the input ends of the judgment unit.

As shown in FIGS. 2 to 4, isolation is realized via the optocouplers U13, U23 and U33.

In one embodiment of the relay diagnostic circuit of the present invention, the isolation unit includes an isolation chip, and the input ends of the isolation chip are connected to the output ends of the voltage divider branches respectively, and the output ends of the isolation chip are connected to the input end of the judgment unit.

As shown in FIG. 5, when the main positive relay S41 and the precharge relay S42 are in the state of disconnection and none of them is in a state of adhesion failure, the voltage difference across the contacts of the main positive relay S41 is relatively large, which makes the voltage difference reflected in V41 and V42 by the voltage divider resistors R42, R43 and R44, R45 connected to the reference GND relatively large. The output voltage signals V41 and V42 are input to the comparison circuit composed of comparator U41, comparator U42 and the like, resulting in a combined output signal: pull-down. The pull-down signal from the comparison circuit is converted to a low level and input to the digital isolation chip U43 so that the corresponding output pin of the U43 also outputs a low level signal. The low level signal from U43 will be detected by MCU, and the main positive relay S41 and the precharge relay S42 will be diagnosed as in a state of non-adhesion in view of the driving state of the relay.

When the main positive relay S41 and the precharge relay S42 are in the state of disconnection and one of them has been in the state of adhesion failure, the voltage difference across the contacts of the main positive relay S41 is closes to zero, which makes the voltage difference reflected in V41 and V42 by the voltage divider resistors R42, R43 and R44, R45 connected to the reference GND closes to zero. The output voltage signals V41 and V42 are input to a comparison circuit composed of comparator U41, comparator U42 and the like, resulting in a combined output signal: high impedance. The high impedance signal from the comparison circuit will be converted to the high level and input to the digital isolation chip U43 so that the corresponding output pin of the U43 also outputs a high level signal. The high level signal from U43 will be detected by MCU, and the main positive relay S41 or the precharge relay S42 will be diagnosed as in the state of adhesion in view of the driving state of the relay.

When the main negative relay S43 is in the state of disconnection and has not been in the state of adhesion failure, the voltage difference across the contacts of the main negative relay S43 is relatively large, which makes the voltage difference reflected in V43 and V44 by the voltage divider resistors R46, R47 and R48, R49 connected to the reference GND relatively large. The output voltage signals V43 and V44 are input to the comparison circuit composed of comparator U44, comparator U45 and the like, resulting in a combined output signal: pull-down. The pull-down signal from the comparison circuit is converted to the low level input to the digital isolation chip U46 so that the corresponding output pin of the U46 also outputs a low level signal. The low level signal from U46 will be detected by the MCU, and the main negative relay S43 will be diagnosed in the state of non-adhesion in view of the driving state of the relay.

When the main negative relay S43 is in the state of disconnection and in the state of adhesion failure, the voltage difference across the contacts of the main negative relay S43 is closes to zero, which makes the voltage difference reflected in V43 and V44 by the voltage divider resistors R46, R47 and R48, R49 connected to the reference GND closes to zero. The output voltage signals V43 and V44 are input to the comparison circuit composed of comparator U44, comparator U45 and the like, resulting in a combined output signal: high impedance. The high impedance signal from the comparison circuit will be converted to the high level input to the digital isolation chip U46 so that the corresponding output pin of the U46 also outputs the high level signal. The high level signal from U46 will be detected by the MCU, and the main negative relay S43 will be diagnosed in the state of adhesion in view of the driving state of the relay.

When the main positive relay S41 is closed and has not been in the state of open circuit failure, the voltage difference across the contacts of the main positive relay S41 is closes to zero, which makes the voltage difference reflected in V41 and V42 by the voltage divider resistors R42, R43 and R44, R45 connected to the reference GND closes to zero. The output voltage signals V41 and V42 are input to the comparison circuit composed of comparator U41, comparator U42 and the like, resulting in a combined output signal: high impedance. The high impedance signal from the comparison circuit will be converted to the high level input to the digital isolation chip U43 so that the corresponding output pin of the U43 also outputs the high level signal. The high level signal from U43 will be detected by the MCU, and the main positive relay S41 has not been in the state of open circuit failure which will be diagnosed in view of the driving state of the relay.

When the main positive relay S41 is closed and has been in the state of open circuit failure, the voltage difference across the contacts of the main positive relay S41 is relatively large, which makes the voltage difference reflected in V41 and V42 by the voltage divider resistors R42, R43 and R44, R45 connected to the reference GND relatively large. The output voltage signals V41 and V42 are input to the comparison circuit composed of comparator U41, comparator U42 and the like, resulting in a combined output signal: pull-down. The pull-down signal from the comparison circuit will be converted to a low level input to the digital isolation chip U43 so that the corresponding output pin of the U43 also outputs the low level signal. The low level signal from U43 will be detected by the MCU, and the main positive relay S41 has been in the state of open circuit failure which will be diagnosed in view of the driving state of the relay.

When the main negative relay S43 is closed and has not been in the state of open circuit failure, the voltage difference across the contacts of the main negative relay S43 is closes to zero, which makes the voltage difference reflected in V43 and V44 by the voltage divider resistors R46, R47 and R48, R49 connected to the reference GND closes to zero. The output voltage signals V43 and V44 are input to the comparison circuit composed of comparator U44, comparator U45 and the like, resulting in a combined output signal: high impedance. The high impedance signal from the comparison circuit will be converted to a high level input to the digital isolation chip U46 so that the corresponding output pin of the U46 also outputs the high level signal. The high level signal from U46 will be detected by the MCU, and the main negative relay S43 has not been in the state of open circuit failure which will be diagnosed in view of the driving state of the relay.

When the main negative relay S43 is closed and has been in the state of open circuit failure, the voltage difference across the contacts of the main negative relay S43 is relatively large, which makes the voltage difference reflected in V43 and V44 by the voltage divider resistors R46, R47 and R48, R49 connected to the reference GND relatively large. The output voltage signals V43 and V44 are input to the comparison circuit composed of comparator U44, comparator U45 and the like, resulting in a combined output signal: pull-down. The pull-down signal from the comparison circuit will be converted to a low level input to the digital isolation chip U46 so that the corresponding output pin of the U46 also outputs the low level signal. The low level signal from U46 will be detected by the MCU, and the main negative relay S43 has been in the state of open circuit failure which will be diagnosed in view of the driving state of the relay.

As shown in FIG. 6, when the main positive relay S51 and the precharge relay S52 are in the state of disconnection and none of them has been in the state of adhesion failure, the voltage difference across the contacts of the main positive relay S51 is relatively large, which makes the voltage difference reflected in V51 and V52 by the voltage divider resistors R52, R53 and R54, R55 connected to the reference GND relatively large. The output voltage signals V51 and V52 are input to the comparison circuit composed of comparator U51, comparator U52 and the like, resulting in a combined output signal: pull-down. The pull-down signal from the comparison circuit is converted to a low level input to the slave MCU U56 which will detect the state of the signal and transmit the information of the state to the master MCU U57 through the digital isolation chip U53. The main positive relay S51 and the precharge relay S52 will be diagnosed in the state of non-adhesion in view of the driving state of the relay by the master MCU U57.

When the main positive relay S51 and the precharge relay S52 are in the state of disconnection and one of them has been in the state of adhesion failure, the voltage difference across the contacts of the main positive relay S51 is closes to zero, which makes the voltage difference reflected in V51 and V52 by the voltage divider resistors R52, R53 and R54, R55 connected to the reference GND closes to zero. The output voltage signals V51 and V52 are input to the comparison circuit composed of comparator U51, comparator U52 and the like, resulting in a combined output signal: high impedance. The high impedance signal from the comparison circuit is converted to a high level input to the slave MCU U56 which will detect the state of the signal and transmit the information of the state to the master MCU U57 through the digital isolation chip U53. The main positive relay S51 or the precharge relay S52 will be diagnosed in the state of adhesion in view of the driving state of the relay by the master MCU U57.

When the main negative relay S53 is in the state of disconnection and has not been in the state of adhesion failure, the voltage difference across the contacts of the main negative relay S53 is relatively large, which makes the voltage difference reflected in V53 and V54 by the voltage divider resistors R56, R57 and R58, R59 connected to the reference GND relatively large. The output voltage signals V53 and V54 are input to the comparison circuit composed of comparator U54, comparator U55 and the like, resulting in a combined output signal: pull-down. The pull-down signal from the comparison circuit is converted to a low level input to the slave MCU U56 which will detect the state of the signal and transmit the information of the state to the master MCU U57 through the digital isolation chip U53. The main negative relay S53 will be diagnosed in the state of non-adhesion in view of the driving state of the relay by the master MCU U57.

When the main negative relay S53 is in the state of disconnection and has been in the state of adhesion failure, the voltage difference across the contacts of the main negative relay S53 is closes to zero, which makes the voltage difference reflected in V53 and V54 by the voltage divider resistors R56, R57 and R58, R59 connected to the reference GND closes to zero. The output voltage signals V53 and V54 are input to the comparison circuit composed of comparator U54, comparator U55 and the like, resulting in a combined output signal: high impedance. The high impedance signal from the comparison circuit is converted to a high level input to the slave MCU U56 which will detect the state of the signal and transmit the information of the state to the master MCU U57 through the digital isolation chip U53. The main negative relay S53 will be diagnosed in the state of adhesion in view of the driving state of the relay by the master MCU U57.

When the main positive relay S51 is closed and has not been in the state of open circuit failure, the voltage difference across the contacts of the main positive relay S51 is closes to zero, which makes the voltage difference reflected in V51 and V52 by the voltage divider resistors R52, R53 and R54, R55 connected to the reference GND closes to zero. The output voltage signals V51 and V52 are input to the comparison circuit composed of comparator U51, comparator U52 and the like, resulting in a combined output signal: high impedance. The high impedance signal from the comparison circuit is converted to a high level input to the slave MCU U56 which will detect the state of the signal and transmit the information of the state to the master MCU U57 through the digital isolation chip U53. The main positive relay S51 has not been in the state of open circuit failure which will be diagnosed in view of the driving state of the relay by the master MCU U57.

When the main positive relay S51 is closed and has been in the state of open circuit failure, the voltage difference across the contacts of the main positive relay S51 is relatively large, which makes the voltage difference reflected in V51 and V52 by the voltage divider resistors R52, R53 and R54, R55 connected to the reference GND relatively large. The output voltage signals V51 and V52 are input to the comparison circuit composed of comparator U51, comparator U52 and the like, resulting in a combined output signal: pull-down. The pull-down signal from the comparison circuit is converted to a low level input to the slave MCU U56 which will detect the state of the signal and transmit the information of the state to the master MCU U57 through the digital isolation chip U53. The main positive relay S51 has been in the state of open circuit failure which will be diagnosed in view of the driving state of the relay by the master MCU U57.

When the main negative relay S53 is closed and has not been in the state of open circuit failure, the voltage difference across the contacts of the main negative relay S53 is closes to zero, which makes the voltage difference reflected in V53 and V54 by the voltage divider resistors R56, R57 and R58, R59 connected to the reference GND closes to zero. The output voltage signals V53 and V54 are input to the comparison circuit composed of comparator U54, comparator U55 and the like, resulting in a combined output signal: high impedance. The high impedance signal from the comparison circuit is converted to a high level input to the slave MCU U56 which will detect the state of the signal and transmit the information of the state to the master MCU U57 through the digital isolation chip U53. The main negative relay S53 has not been in the state of open circuit failure which will be diagnosed in view of the driving state of the relay by the master MCU U57.

When the main negative relay S53 is closed and has been in the state of open circuit failure, the voltage difference across the contacts of the main negative relay S53 is relatively large, which makes the voltage difference reflected in V53 and V54 by the voltage divider resistors R56, R57 and R58, R59 connected to the reference GND relatively large. The output voltage signals V53 and V54 are input to the comparison circuit composed of comparator U54, comparator U55 and the like, resulting in a combined output signal: pull-down. The pull-down signal from the comparison circuit is converted to a low level input to the slave MCU U56 which will detect the state of the signal and transmit the information of the state to the master MCU U57 through the digital isolation chip U53. The main negative relay S53 has been in the state of open circuit failure which will be diagnosed in view of the driving state of the relay by the master MCU U57.

As shown in FIG. 7, the isolation is achieved by access of an isolation chip U63.

In one embodiment of the relay diagnostic circuit of the present invention, the relay diagnostic circuit further includes a comparison unit configured to compare the divider voltages output from the two voltage divider branches at both ends of the same relay, output the comparison information to the isolation unit, and output the comparison information to the judgment unit after the isolation of the isolation unit.

In one embodiment of the relay diagnostic circuit of the present invention, the comparison unit includes a number of comparator groups. Each comparator group includes a forward comparator and a reverse comparator. The two comparators of the same comparator group correspond to the same relay. The output end of one of the voltage divider branches for obtaining the output voltage of the first end of the corresponding relay is connected to the positive input end of the forward comparator and the negative input end of the reverse comparator. The output end of the other voltage divider branch for obtaining the output voltage of the second end corresponding to the relay is connected to the negative input end of the forward comparator and the positive input end of the reverse comparator. The output of the forward comparator and the reverse comparator of each comparator group is connected as the output end of the comparator group. The output ends of the comparator groups are respectively connected to the input ends of the isolation unit.

As shown in FIG. 2, when the main positive relay S11 and the precharge relay S12 are in the state of disconnection and none of them has been in the state of adhesion failure, the voltage difference across the contacts of the main positive relay S11 is relatively large, which makes the voltage difference reflected in V11 and V12 by the voltage divider resistors R12, R13 and R14, R15 connected to the reference GND relatively large. The output voltage signals V11 and V12 are input to the comparison circuit composed of comparator U1, comparator U12 and the like, resulting in a combined output signal: pull-down. The pull-down signal from the comparison circuit will drive the optocoupler U13 so that the optocoupler U13 also outputs a pull-down signal. The MCU will detect a logic low level due to the pull-down signal from the optocoupler U13, and the main positive relay S11 and the precharge relay S12 will be diagnosed in the state of non-adhesion in view of the driving state of the relay by the MCU.

When the main positive relay S11 and the precharge relay S12 are in the state of disconnection and one of them has been in the state of adhesion failure, the voltage difference across the contacts of the main positive relay S11 is closes to zero, which makes the voltage difference reflected in V11 and V12 by the voltage divider resistors R12, R13 and R14, R15 connected to the reference GND closes to zero. The output voltage signals V11 and V12 are input to the comparison circuit composed of comparator U11, comparator U12 and the like, resulting in a combined output signal: high impedance. The high impedance signal from the comparison circuit will not drive the optocoupler U13 so that the optocoupler U13 also outputs a high impedance signal. The MCU will detect a logic high level due to the high impedance signal from the optocoupler U13, and the main positive relay S11 or the precharge relay S12 will be diagnosed in the state of adhesion in view of the driving state of the relay by the MCU.

When the main negative relay S13 is in the state of disconnection and has not been in the state of adhesion failure, the voltage difference across the contacts of the main negative relay S13 is relatively large, which makes the voltage difference reflected in V13 and V14 by the voltage divider resistors R16, R17 and R18, R19 connected to the reference GND relatively large. The output voltage signals V13 and V14 are input to the comparison circuit composed of comparator U14, comparator U15 and the like, resulting in a combined output signal: pull-down. The pull-down signal from the comparison circuit will drive the optocoupler U16 so that the optocoupler U16 also outputs a pull-down signal. The MCU will detect a logic low level due to the pull-down signal from the optocoupler U16, and the main negative relay S13 will be diagnosed in the state of non-adhesion in view of the driving state of the relay by the MCU.

When the main negative relay S13 is in the state of disconnection and has been in the state of adhesion failure, the voltage difference across the contacts of the main negative relay S13 is closes to zero, which makes the voltage difference reflected in V13 and V14 by the voltage divider resistors R16, R17 and R18, R19 connected to the reference GND closes to zero. The output voltage signals V13 and V14 are input to the comparison circuit composed of comparator U14, comparator U15 and the like, resulting in a combined output signal: high impedance. The high impedance signal from the comparison circuit will not drive the optocoupler U16 so that the optocoupler U16 also outputs a high impedance signal. The MCU will detect a logic high level due to the high impedance signal from the optocoupler U16, and the main negative relay S13 will be diagnosed in the state of adhesion in view of the driving state of the relay by the MCU.

When the main positive relay S11 is closed and has not been in the state of open circuit failure, the voltage difference across the contacts of the main positive relay S11 is closes to zero, which makes the voltage difference reflected in V11 and V12 by the voltage divider resistors R12, R13 and R14, R15 connected to the reference GND closes to zero. The output voltage signals V11 and V12 are input to the comparison circuit composed of comparator U1f, comparator U12 and the like, resulting in a combined output signal: high impedance. The high impedance signal from the comparison circuit will not drive the optocoupler U13 so that the optocoupler U13 also outputs a high impedance signal. The MCU will detect a logic high level due to the high impedance signal from the optocoupler U13, and the main positive relay S11 has not been in the state of open circuit failure which will be diagnosed in view of the driving state of the relay by the MCU.

When the main positive relay S11 is closed and has been in the state of open circuit failure, the voltage difference across the contacts of the main positive relay S11 is relatively large, which makes the voltage difference reflected in V11 and V12 by the voltage divider resistors R12, R13 and R14, R15 connected to the reference GND relatively large. The output voltage signals V11 and V12 are input to the comparison circuit composed of comparator U11, comparator U12 and the like, resulting in a combined output signal: pull-down. The pull-down signal from the comparison circuit will drive the optocoupler U13 so that the optocoupler U13 also outputs a pull-down signal. The MCU will detect a logic low level due to the pull-down signal from the optocoupler U13, and the main positive relay S11 has been in the state of open circuit failure which will be diagnosed in view of the driving state of the relay by the MCU.

When the main negative relay S13 is closed and has not been in the state of open circuit failure, the voltage difference across the contacts of the main negative relay S13 is closes to zero, which makes the voltage difference reflected in V13 and V14 by the voltage divider resistors R16, R17 and R18, R19 connected to the reference GND closes to zero. The output voltage signals V13 and V14 are input to the comparison circuit composed of comparator U14, comparator U15 and the like, resulting in a combined output signal: high impedance. The high impedance signal from the comparison circuit will not drive the optocoupler U16 so that the optocoupler U16 also outputs a high impedance signal. The MCU will detect a logic high level due to the high impedance signal from the optocoupler U16, and the main positive relay S13 has not been in the state of open circuit failure which will be diagnosed in view of the driving state of the relay by the MCU.

When the main negative relay S13 is closed and has been in the state of open circuit failure, the voltage difference across the contacts of the main negative relay S13 is relatively large, which makes the voltage difference reflected in V13 and V14 by the voltage divider resistors R16, R17 and R18, R19 connected to the reference GND relatively large. The output voltage signals V13 and V14 are input to the comparison circuit composed of comparator U14, comparator U15 and the like, resulting in a combined output signal: pull-down. The pull-down signal from the comparison circuit will drive the optocoupler U16 so that the optocoupler U16 also outputs a pull-down signal. The MCU will detect a logic low level due to the pull-down signal from the optocoupler U16, and the main negative relay S13 has been in the state of open circuit failure which will be diagnosed in view of the driving state of the relay by the MCU.

As shown in FIGS. 3 and 4, the comparison of voltage is achieved by comparators U21, U22, U24, U25, U31, U32, U34, U35.

In one embodiment of the relay diagnostic circuit of the present invention, the relay diagnostic circuit further includes an analog-to-digital conversion unit configured to convert the divider voltage output from the voltage divider branch into digital information and output the digital information to the isolation unit, and output the digital information of the divider voltage to the judgment unit after the isolation and conversion of the isolation unit.

In one embodiment of the relay diagnostic circuit of the present invention, the analog-to-digital conversion unit is an analog-to-digital conversion chip, and the input ends of the analog-to-digital conversion chip are connected to the output ends of the voltage divider branches respectively, and the output end of the analog-to-digital conversion chip is connected to the input end of the isolation unit.

As shown in FIG. 7, when the main positive relay S61 and the precharge relay S62 are in the state of disconnection and none of them has been in the state of adhesion failure, the voltage difference across the contacts of the main positive relay S61 is relatively large, which makes the voltage difference reflected in V61 and V62 by the voltage divider resistors R62, R63 and R64, R65 connected to the reference GND relatively large. The output voltage signals V61 and V62 are input to the ADC chip U61 and obtain a converted digital quantity. The ADC chip U61 sends the digital quantity to the MCU U67 through the digital isolation chip U63 by means of communication. The main positive relay S61 and the precharge relay S62 will be diagnosed in the state of non-adhesion in view of the driving state of the relay by the MCU U67.

When the main positive relay S61 and the precharge relay S62 are in the state of disconnection and one of them has been in the state of adhesion failure, the voltage difference across the contacts of the main positive relay S61 is closes to zero, which makes the voltage difference reflected in V61 and V62 by the voltage divider resistors R62, R63 and R64, R65 connected to the reference GND closes to zero. The output voltage signals V61 and V62 are input to the ADC chip U61 and obtain a converted digital quantity. The ADC chip U61 sends the digital quantity to the MCU U67 through the digital isolation chip U63 by means of communication. The main positive relay S61 or the precharge relay S62 will be diagnosed in the state of adhesion in view of the driving state of the relay by the MCU U67.

When the main negative relay S63 is in the state of disconnection and has not been in the state of adhesion failure, the voltage difference across the contacts of the main negative relay S63 is relatively large, which makes the voltage difference reflected in V63 and V64 by the voltage divider resistors R66, R67 and R68, R69 connected to the reference GND relatively large. The output voltage signals V63 and V64 are input to the ADC chip U61 and obtain a converted digital quantity. The ADC chip U61 sends the digital quantity to the MCU U67 through the digital isolation chip U63 by means of communication. The main negative relay S63 will be diagnosed in the state of non-adhesion in view of the driving state of the relay by the MCU U67.

When the main negative relay S63 is in the state of disconnection and has been in the state of adhesion failure, the voltage difference across the contacts of the main negative relay S63 is closes to zero, which makes the voltage difference reflected in V63 and V64 by the voltage divider resistors R66, R67 and R68, R69 connected to the reference GND closes to zero. The output voltage signals V63 and V64 are input to the ADC chip U61 and obtain a converted digital quantity. The ADC chip U61 sends the digital quantity to the MCU U67 through the digital isolation chip U63 by means of communication. The main negative relay S63 will be diagnosed in the state of adhesion in view of the driving state of the relay by the MCU U67.

When the main positive relay S61 is closed and has not been in the state of open circuit failure, the voltage difference across the contacts of the main positive relay S61 is closes to zero, which makes the voltage difference reflected in V61 and V62 by the voltage divider resistors R62, R63 and R64, R65 connected to the reference GND closes to zero. The output voltage signals V61 and V62 are input to the ADC chip U61 and obtain a converted digital quantity. The ADC chip U61 sends the digital quantity to the MCU U67 through the digital isolation chip U63 by means of communication. The main positive relay S61 has not been in the state of open circuit failure which will be diagnosed in view of the driving state of the relay by the MCU U67.

When the main positive relay S61 is closed and has been in the state of open circuit failure, the voltage difference across the contacts of the main positive relay S61 is relatively large, which makes the voltage difference reflected in V61 and V62 by the voltage divider resistors R62, R63 and R64, R65 connected to the reference GND relatively large. The output voltage signals V61 and V62 are input to the ADC chip U61 and obtain a converted digital quantity. The ADC chip U61 sends the digital quantity to the MCU U67 through the digital isolation chip U63 by means of communication. The main positive relay S61 has been in the state of open circuit failure which will be diagnosed in view of the driving state of the relay by the MCU U67.

When the main negative relay S63 is closed and has not been in the state of open circuit failure, the voltage difference across the contacts of the main negative relay S63 is closes to zero, which makes the voltage difference reflected in V63 and V64 by the voltage divider resistors R66, R67 and R68, R69 connected to the reference GND closes to zero. The output voltage signals V63 and V64 are input to the ADC chip U61 and obtain a converted digital quantity. The ADC chip U61 sends the digital quantity to the MCU U67 through the digital isolation chip U63 by means of communication. The main negative relay S63 has not been in the state of open circuit failure which will be diagnosed in view of the driving state of the relay by the MCU U67.

When the main negative relay S63 is closed and has been in the state of open circuit failure, the voltage difference across the contacts of the main negative relay S63 is relatively large, which makes the voltage difference reflected in V63 and V64 by the voltage divider resistors R66, R67 and R68, R69 connected to the reference GND relatively large. The output voltage signals V63 and V64 are input to the ADC chip U61 and obtain a converted digital quantity. The ADC chip U61 sends the digital quantity to the MCU U67 through the digital isolation chip U63 by means of communication. The main negative relay S63 has been in the state of open circuit failure which will be diagnosed in view of the driving state of the relay by the MCU U67.

In one embodiment of the relay diagnostic circuit of the present invention, the analog-to-digital conversion unit is a slave MCU, the input ends of the slave MCU are respectively connected to the output ends of the voltage divider branches, and the output end of the slave MCU is connected to the input end of the isolation unit.

As shown in FIG. 8, when the main positive relay S71 and the precharge relay S72 are in the state of disconnection and none of them has been in the state of adhesion failure, the voltage difference across the contacts of the main positive relay S71 is relatively large, which makes the voltage difference reflected in V71 and V72 by the voltage divider resistors R72, R73 and R74, R75 connected to the reference GND relatively large. The output voltage signals V71 and V72 are input to the ADC port of the slave MCU U71 and obtain the converted digital quantity. The slave MCU U71 sends the digital quantity to the master MCU U77 through the digital isolation chip U73 by means of communication. The main positive relay S71 and the precharge relay S72 will be diagnosed in the state of non-adhesion in view of the driving state of the relay by the master MCU U77.

When the main positive relay S71 and the precharge relay S72 are in the state of disconnection and one of them has been in the state of adhesion failure, the voltage difference across the contacts of the main positive relay S71 is closes to zero, which makes the voltage difference reflected in V71 and V72 by the voltage divider resistors R72, R73 and R74, R75 connected to the reference GND closes to zero. The output voltage signals V71 and V72 are input to the ADC port of the slave MCU U71 and obtain the converted digital quantity. The slave MCU U71 sends the digital quantity to the master MCU U77 through the digital isolation chip U73 by means of communication. The main positive relay S71 or the precharge relay S72 will be diagnosed in the state of adhesion in view of the driving state of the relay by the master MCU U77.

When the main negative relay S73 is in the state of disconnection and has not been in the state of adhesion failure, the voltage difference across the contacts of the main negative relay S73 is relatively large, which makes the voltage difference reflected in V73 and V74 by the voltage divider resistors R76, R77 and R78, R79 connected to the reference GND relatively large. The output voltage signals V73 and V74 are input to the ADC port of the slave MCU U71 and obtain the converted digital quantity. The slave MCU U71 sends the digital quantity to the master MCU U77 through the digital isolation chip U73 by means of communication. The main negative relay S73 will be diagnosed in the state of non-adhesion in view of the driving state of the relay by the master MCU U77.

When the main negative relay S73 is in the state of disconnection and has been in the state of adhesion failure, the voltage difference across the contacts of the main negative relay S73 is closes to zero, which makes the voltage difference reflected in V73 and V74 by the voltage divider resistors R76, R77 and R78, R79 connected to the reference GND closes to zero. The output voltage signals V73 and V74 are input to the ADC port of the slave MCU U71 and obtain the converted digital quantity. The slave MCU U71 sends the digital quantity to the master MCU U77 through the digital isolation chip U73 by means of communication. The main negative relay S73 will be diagnosed in the state of adhesion in view of the driving state of the relay by the master MCU U77.

When the main positive relay S71 is closed and has not been in the state of open circuit failure, the voltage difference across the contacts of the main positive relay S71 is closes to zero, which makes the voltage difference reflected in V71 and V72 by the voltage divider resistors R72, R73 and R74, R75 connected to the reference GND closes to zero. The output voltage signals V71 and V72 are input to the ADC port of the slave MCU U71 and obtain the converted digital quantity. The slave MCU U71 sends the digital quantity to the master MCU U77 through the digital isolation chip U73 by means of communication. The main positive relay S71 has not been in the state of open circuit failure which will be diagnosed in view of the driving state of the relay by the master MCU U77.

When the main positive relay S71 is closed and has been in the state of open circuit failure, the voltage difference across the contacts of the main positive relay S71 is relatively large, which makes the voltage difference reflected in V71 and V72 by the voltage divider resistors R72, R73 and R74, R75 connected to the reference GND relatively large. The output voltage signals V71 and V72 are input to the ADC port of the slave MCU U71 and obtain the converted digital quantity. The slave MCU U71 sends the digital quantity to the master MCU U77 through the digital isolation chip U73 by means of communication. The main positive relay S71 has been in the state of open circuit failure which will be diagnosed in view of the driving state of the relay by the master MCU U77.

When the main negative relay S73 is closed and has not been in the state of open circuit failure, the voltage difference across the contacts of the main negative relay S73 is closes to zero, which makes the voltage difference reflected in V73 and V74 by the voltage divider resistors R76, R77 and R78, R79 connected to the reference GND closes to zero. The output voltage signals V73 and V74 are input to the ADC port of the slave MCU U71 and obtain the converted digital quantity. The slave MCU U71 sends the digital quantity to the master MCU U77 through the digital isolation chip U73 by means of communication. The main negative relay S73 has not been in the state of open circuit failure which will be diagnosed in view of the driving state of the relay by the master MCU U77.

When the main negative relay S73 is closed and has been in the state of open circuit failure, the voltage difference across the contacts of the main negative relay S73 is relatively large, which makes the voltage difference reflected in V73 and V74 by the voltage divider resistors R76, R77 and R78, R79 connected to the reference GND relatively large. The output voltage signals V73 and V74 are input to the ADC port of the slave MCU U71 and obtain the converted digital quantity. The slave MCU U71 sends the digital quantity to the master MCU U77 through the digital isolation chip U73 by means of communication. The main negative relay S73 has been in the state of open circuit failure which will be diagnosed in view of the driving state of the relay by the master MCU U77.

In one embodiment of the relay diagnostic circuit of the present invention as shown in FIGS. 2 to 8, the judgment unit is a master MCU of U17, U27, U37, U47, U57, U67, U77, and the input end of the master MCU is connected to the output end of the isolation unit.

Compared with the conventional technologies, the relay diagnostic circuit according to the present invention has the following advantages:

1. The two reference grounds in the cross voltage sampling are combined into a reference ground by optimizing the resistance topology, so as to avoid the problem of potential reverse current.

2. The reliability of the circuit has been improved by replacing the ADC sampling chip with a comparator chip to reduce circuit complexity. The reliability of the circuit has been improved by combining the two isolated power supplies in the cross voltage sampling into one isolated power supply to reduce circuit complexity.

3. The use of comparator logic output judgments rather than the numerical operations and logical judgments after the ADC sampling can significantly reduce the computational complexity.

4. The invention has a wide application range, and the invention not only can be applied to the diagnosis of the main positive relay and the main negative relay with the precharge relay, but also can be applied to the diagnosis of the charging relay, the heating relay, the main positive relay and the main negative relay without the precharge relay, and the like.

5. The relay diagnostic circuit does not depend on other relays and can be used at almost all times, which is beneficial to the user experience with the less misdiagnosis, the more diagnostic opportunities, and the more reliable diagnostic results.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions describe example embodiments, it should be appreciated that alternative embodiments without departing from the scope of the appended claims. Although specific terms are employed herein, they are used in a generic and descriptive sense only and not for purposes of limitation.

What is claimed is:

1. A relay diagnostic circuit for a plurality of relays connected in series between an electric vehicle power supply end and a load or a charging end, comprising:

a plurality of voltage divider branches connected to a same reference ground, an isolation unit and a judgment unit, wherein each of the voltage divider branches is configured to obtain a voltage of one end of each relay and output the voltage after dividing the voltage;

the isolation unit is configured to isolate and convert a plurality of divider voltages output from the plurality of voltage divider branches and output the voltages to the judgment unit; and the judgment unit is configured to compare a comparison information of the divider voltages at two ends of each relay with a corresponding driving state of the relay and obtain a diagnosis result of each relay;

and wherein the relay diagnostic circuit further comprises a comparison unit configured to compare divider voltages output from the two voltage divider branches at both ends of a same relay, output the comparison information to the isolation unit, and output the comparison information to the judgment unit after the isolation and conversion of the isolation unit the comparison unit comprises a plurality of comparator groups, each comparator group comprises a forward comparator and a reverse comparator, two comparators of a same comparator group correspond to a same relay, output ends of one of the voltage divider branches for obtaining output voltage of the first end of corresponding relay is connected to a positive input end of the forward comparator and a negative input end of the reverse comparator respectively, output ends of the other voltage divider branch for obtaining output voltage of the second end corresponding to the relay is connected to a negative input end of the forward comparator and the positive input end of the reverse comparator, the output ends of the forward comparator and the reverse comparator of each comparator group is connected as a output end of the comparator group, and output ends of each comparator group are connected to input ends of the isolation unit respectively.

2. The relay diagnostic circuit of claim 1, wherein each of the voltage divider branches comprises at least two divider resistors connected in series, a connection point of the divider resistor is an output end of the voltage divider branch to output the divider voltage, each relay corresponds to two voltage divider branches, a first end of each relay is connected to one end of a corresponding voltage divider branch, a second end of the relay is connected to one end of another corresponding voltage divider branch, and other ends of all voltage divider branches are connected to a same reference ground.

3. The relay diagnostic circuit of claim 1, wherein the isolation unit comprises optocouplers, driving ends of the optocouplers are connected to corresponding output ends of the voltage divider branches respectively, and output ends of the optocouplers are connected to input end of the judgment unit.

4. The relay diagnostic circuit of claim 1, wherein the isolation unit comprises an isolation chip, input ends of the isolation chip are connected to corresponding output ends of the voltage divider branches respectively, and the output ends of the isolation chip are connected to an input end of the judgment unit.

5. The relay diagnostic circuit of claim 1, wherein the relay diagnostic circuit further comprises an analog-to-digital conversion unit configured to convert the divider voltage output from a voltage divider branch into digital information, output the digital information to the isolation unit, and output the digital information to the judgment unit after isolation and conversion of the isolation unit.

6. The relay diagnostic circuit of claim 5, wherein the analog-to-digital conversion unit is an analog-to-digital conversion chip, input ends of the analog-to-digital conversion chip are connected to corresponding output ends of the voltage divider branches respectively, and output ends of the analog-to-digital conversion chip are connected to input end of the isolation unit.

7. The relay diagnostic circuit of claim 5, wherein the analog-to-digital conversion unit is a slave micro control unit, input ends of the slave micro control unit are connected to corresponding output ends of the voltage divider branches respectively, and output ends of the slave micro control unit are connected to the input end of the isolation unit.

8. The relay diagnostic circuit of claim 1, wherein the judgment unit is a master micro control unit and an input end of the master micro control unit is connect to an output end of the isolation unit.

* * * * *